United States Patent

Golla et al.

[19]

[11] Patent Number: 5,812,017
[45] Date of Patent: Sep. 22, 1998

[54] CHARGE PUMP VOLTAGE MULTIPLIER CIRCUIT

[75] Inventors: Carla Golla, Sesto San Giovanni; William Vespi, Forlí, both of Italy

[73] Assignee: SGS-Thomson Microelectronics, S.r.l., Agrate Brianza, Italy

[21] Appl. No.: 567,328

[22] Filed: Dec. 5, 1995

[30] Foreign Application Priority Data

Dec. 5, 1994 [EP] European Pat. Off. .............. 94830563

[51] Int. Cl.⁶ ........................................ G05F 1/10
[52] U.S. Cl. .......................... 327/536; 327/538; 327/544; 327/540; 365/227
[58] Field of Search ..................... 327/536, 537, 327/538, 540, 541, 543, 544, 535; 365/227

[56] References Cited

U.S. PATENT DOCUMENTS

| 4,961,007 | 10/1990 | Kamanoya et al. | 307/296.2 |
|---|---|---|---|
| 5,034,625 | 7/1991 | Min et al. | 327/536 |
| 5,307,315 | 4/1994 | Oowaki et al. | 365/189.09 |
| 5,337,284 | 8/1994 | Cordoba et al. | 365/227 |
| 5,376,840 | 12/1994 | Nakayama | 327/537 |

FOREIGN PATENT DOCUMENTS

| 0 469 587 | 2/1992 | European Pat. Off. . |
|---|---|---|
| 0 545 266 | 6/1993 | European Pat. Off. . |
| 0 609 497 | 8/1994 | European Pat. Off. . |

*Primary Examiner*—Timothy P. Callahan
*Assistant Examiner*—Jung Ho Kim
*Attorney, Agent, or Firm*—David V. Carlson; Robert E. Mates; Seed and Berry LLP

[57] ABSTRACT

A charge pump voltage booster circuit with control feedback of the type comprising an output line connected to a load and on which is produced an output voltage boosted in relation to a supply voltage and a feedback loop incorporating a charge pump connected to said line and a control logic circuit of said pump interlocked with a comparator having an input connected to the line comprises also an auxiliary charge pump connected in turn to said line and designed to supply a quantity of current greater than or equal to the leakage currents of the load in stand-by condition. The auxiliary pump has current consumption much lower than that of the main charge pump. In addition, upon emerging from the off state there is provided starting of the main charge pump for a brief time period sufficient to take the booster output to a sufficient value.

21 Claims, 6 Drawing Sheets

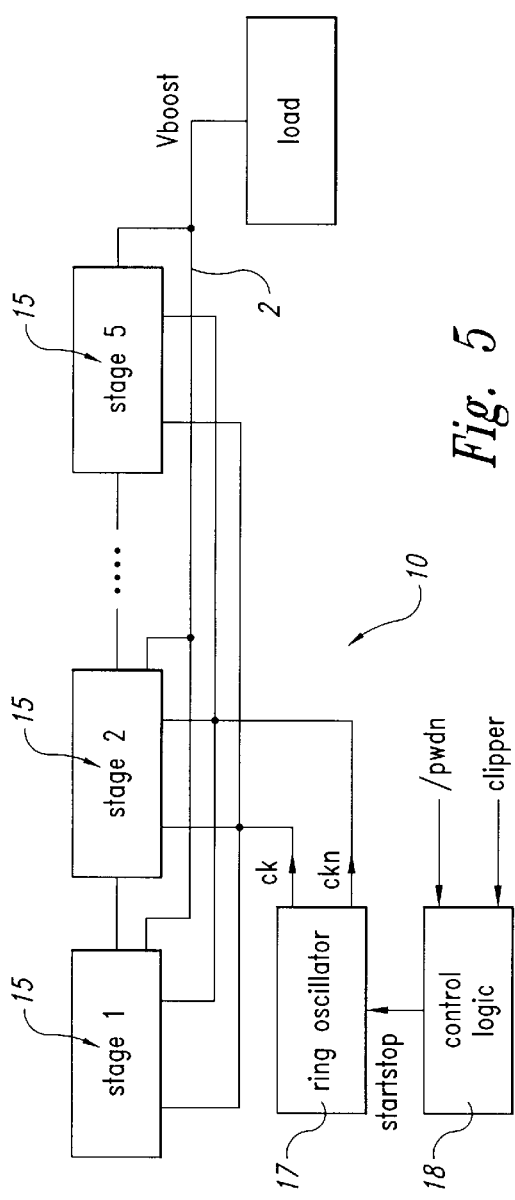
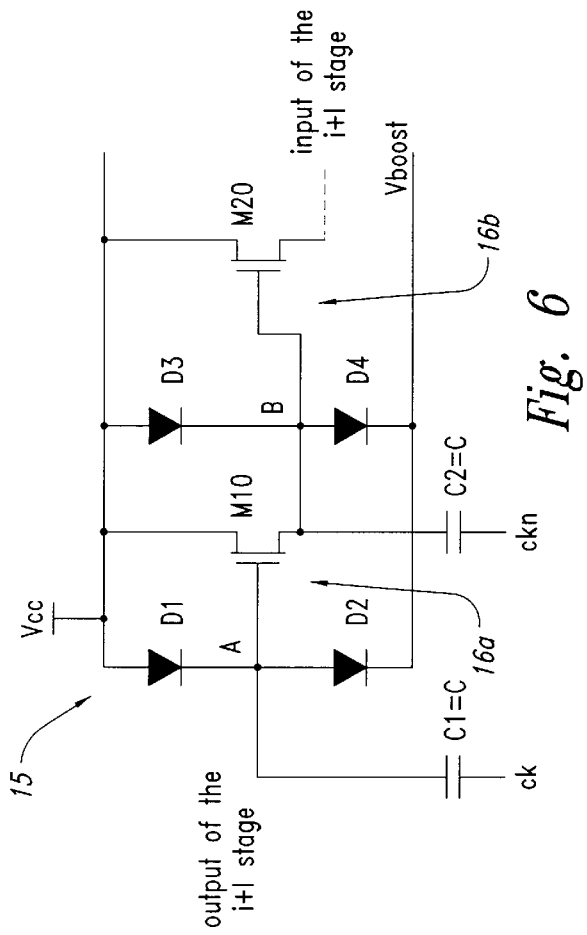
Fig. 5
Fig. 6

CHARGE PUMP VOLTAGE MULTIPLIER CIRCUIT

TECHNICAL FIELD

The present invention relates to integrated circuits, and in particular, to a charge pump voltage booster circuit for maintaining a selected voltage and to a method of holding steady a predetermined voltage level on an output of the charge pump.

BACKGROUND OF THE INVENTION

As is well known, in many applications concerning electronic circuits integrated on semiconductor there is a requirement to generate voltages higher than the power supply Vcc. This requirement is particularly felt in devices supplied with a low voltage or in electrically programmable non-volatile memories, e.g., the EEPROM and/or flash EEPROM type, which require reading voltages greater than the supply voltages. In particular, in the reading phase of this type of integrated memory it is necessary to apply to the control terminals of the individual memory cells a voltage high enough to satisfy the specifications in terms of access time. This voltage is normally generated by means of a special voltage multiplying—or booster—circuit which is commonly provided within the same memory circuit.

A voltage booster circuit of known type is described e.g., in the article "A 4 MB Flash with a 3 V to 5.5 V operating voltage" presented at the thirteenth annual conference of the IEEE on "Non-volatile semiconductor memory workshop" on Feb. 20, 1994. In that article, there is described a booster circuit with charge pump capable of delivering output currents of considerable size (up to a few tenths of a mA). This circuit is provided by means of a negative loop for control of the output voltage Vboost and is shown schematically in FIG. 1. Very briefly, the control loop is achieved by means of a comparator which takes the difference between the output voltage Vboost of the booster and a reference voltage Vref to generate an error signal of the logic type. This error signal drives a charge pump through a control logic.

In greater detail and with particular reference to FIG. 1 a boot circuit increases in a short time the output voltage Vboost up to the power supply (Vcc). The boot circuit is deactivated each time the booster receives a signal PWDN, i.e., Deep Power Down. This signal PWDN is received by the control logic. The charge pump is controlled by the value of a clipper logic circuit. When this signal moves to a high logic value the pump raises the Vboost potential of the output line. The charge pump raises the potential Vboost up to an asymptotic value established by the internal circuitry. The comparator connected upstream of the control logic makes a comparison between a between a signal Vref taken from a reference voltage generator and a feedback signal obtained by taking the output voltage Vboost by means of a voltage divider. The clipper signal is then brought to a low logic value when the following condition occurs.

$$\text{Vref} < \text{Vboost}/K \qquad (1)$$

where K is the division ratio of the divider.
The condition which again activates the charge pump is given by:

$$\text{Vref} > \text{Vboost}/K. \qquad (2)$$

FIG. 2 shows in a single diagram as a function of time the behavior of the constant reference signal Vref and the voltage signals Vboost and Vboost/K. The saw-tooth behavior of the latter signals shows how the hysteresis necessary for correct operation of the control is ensured by time delays inside the negative feedback loop. Although advantageous in some ways and essentially achieving the purpose, this solution proposed by the prior art still exhibits a series of shortcomings as set forth below.

Some simulations made by the applicant show that the consumption of the booster circuit in stand-by state is still excessive in relation to the specifications to be met. Since it is not possible to know "a priori" the duration of the stand-by state nor that of the Deep Power Down state because they are both set by the external user, it is not possible to know by how much the output voltage Vboost drifts downward during these time periods because of the leakage current. The circuit of FIG. 1 illustrated above seeks to solve this problem with the feedback loop which holds the output voltage Vboost relatively steady. But in this manner there is excessive consumption in the stand-by state because the charge pump is started every time the comparator detects excessive output drop. To overcome this shortcoming, the charge pump may be turned off for the entire duration of the stand-by. However, if the voltage Vboost at the booster output falls sufficiently low, it would not be able to ensure a very short access time as called for by the memory circuit specifications to go to a stand-by state originating from the Deep Power Down state.

SUMMARY OF THE INVENTION

Therefore, it is an object of the present invention to provide a charge pump voltage booster circuit having structural and functional characteristics to overcome the shortcomings described above with reference to the prior art.

The present invention relates to a charge pump voltage multiplier circuit including a charge pump having an output connected to a load and a feedback circuit. The feedback circuit includes a comparator having an input connected to the output of the charge pump and a logic circuit connected between the input of the charge pump and an output of the comparator.

According to the principles of the present invention, an auxiliary charge pump is provided to the charge pump voltage multiplier circuit to supply a quantity of current greater than or equal to the leakage currents of the load in stand-by condition but having at the same time a current consumption much lower than that of the main charge pump. In addition, at output from the off state there is provided starting of the main charge pump for a brief time period to take the booster output to a sufficient value required by the load.

The characteristics and advantages of the circuit and method in accordance with the present invention are set forth in the description of an embodiment thereof given below by way of non-limiting example with reference to the annexed drawings.

BRIEF DESCRIPTION OF THE DRAWINGS

FIG. 5 shows a schematic view of a main charge pump of the booster circuit of FIG. 3, FIG. 6 shows a detailed circuit diagram of a portion of the main charge pump of FIG. 5.

DETAILED DESCRIPTION OF THE INVENTION

Figure 1:
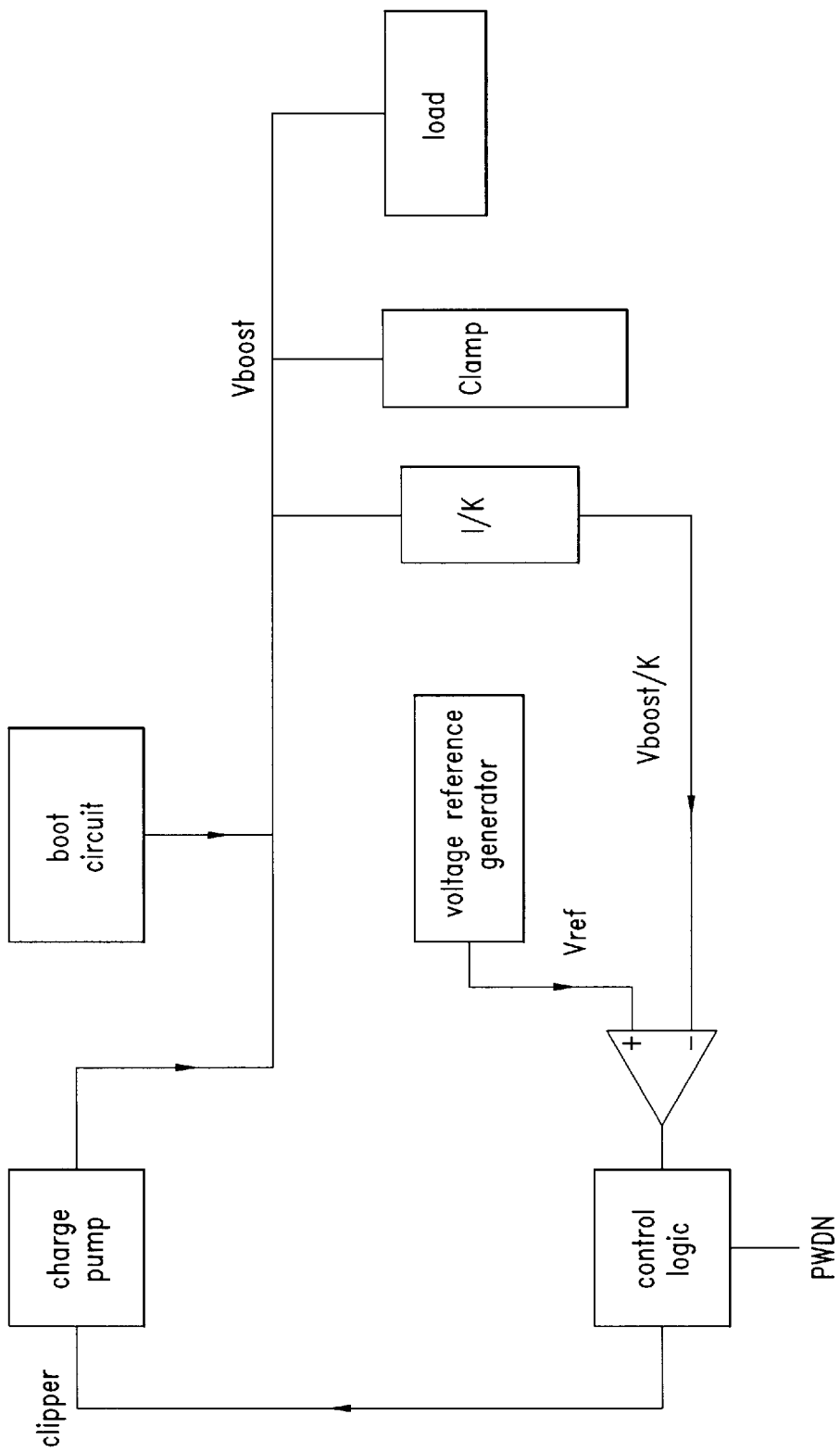
FIG. 1 shows a block diagram of a charge pump booster circuit provided in accordance with the prior art.
Figure 2:
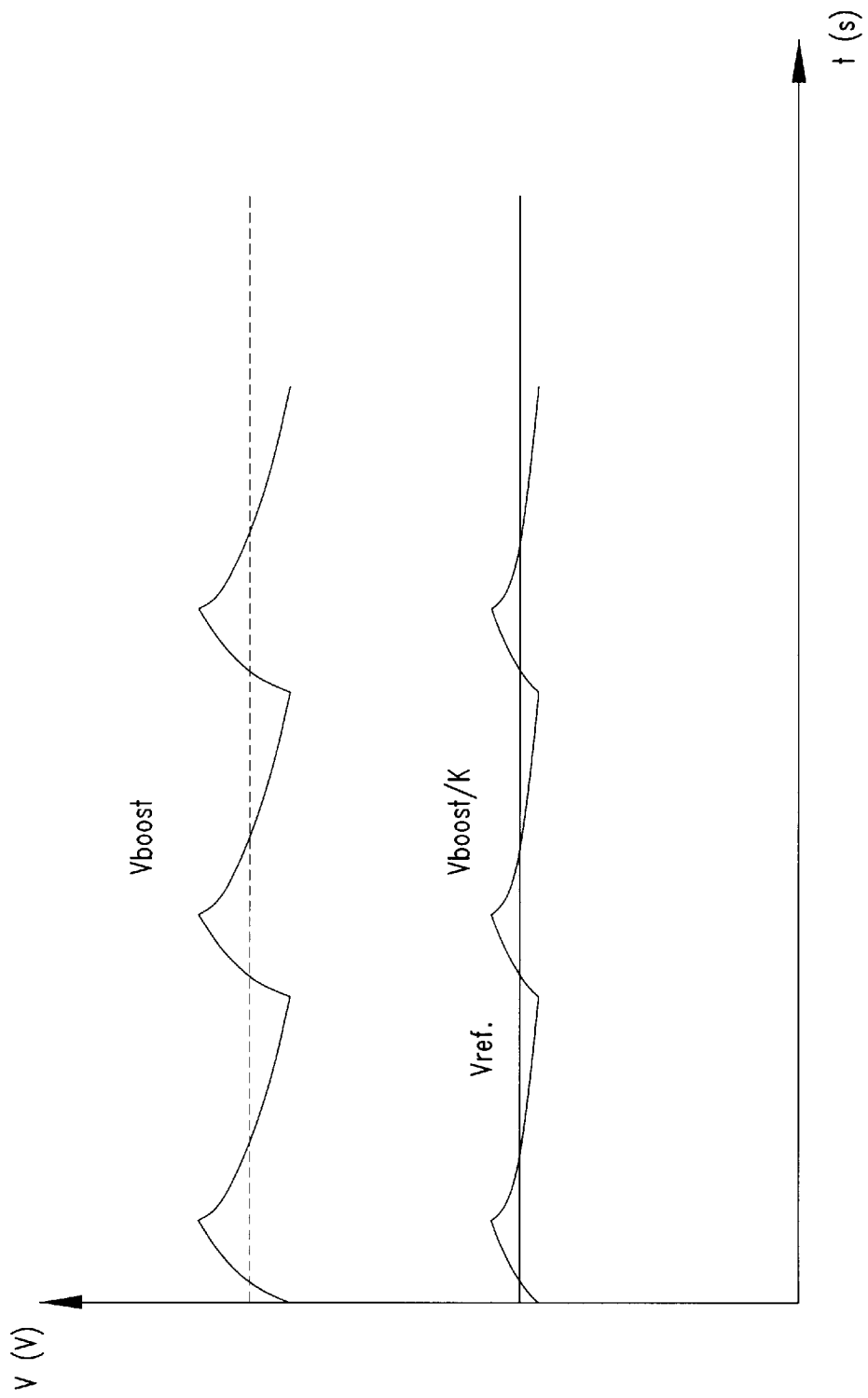
FIG. 2 shows graphically the behavior as a function of time of the output voltage and a reference voltage of the booster circuit of FIG. 1.
Figure 3:
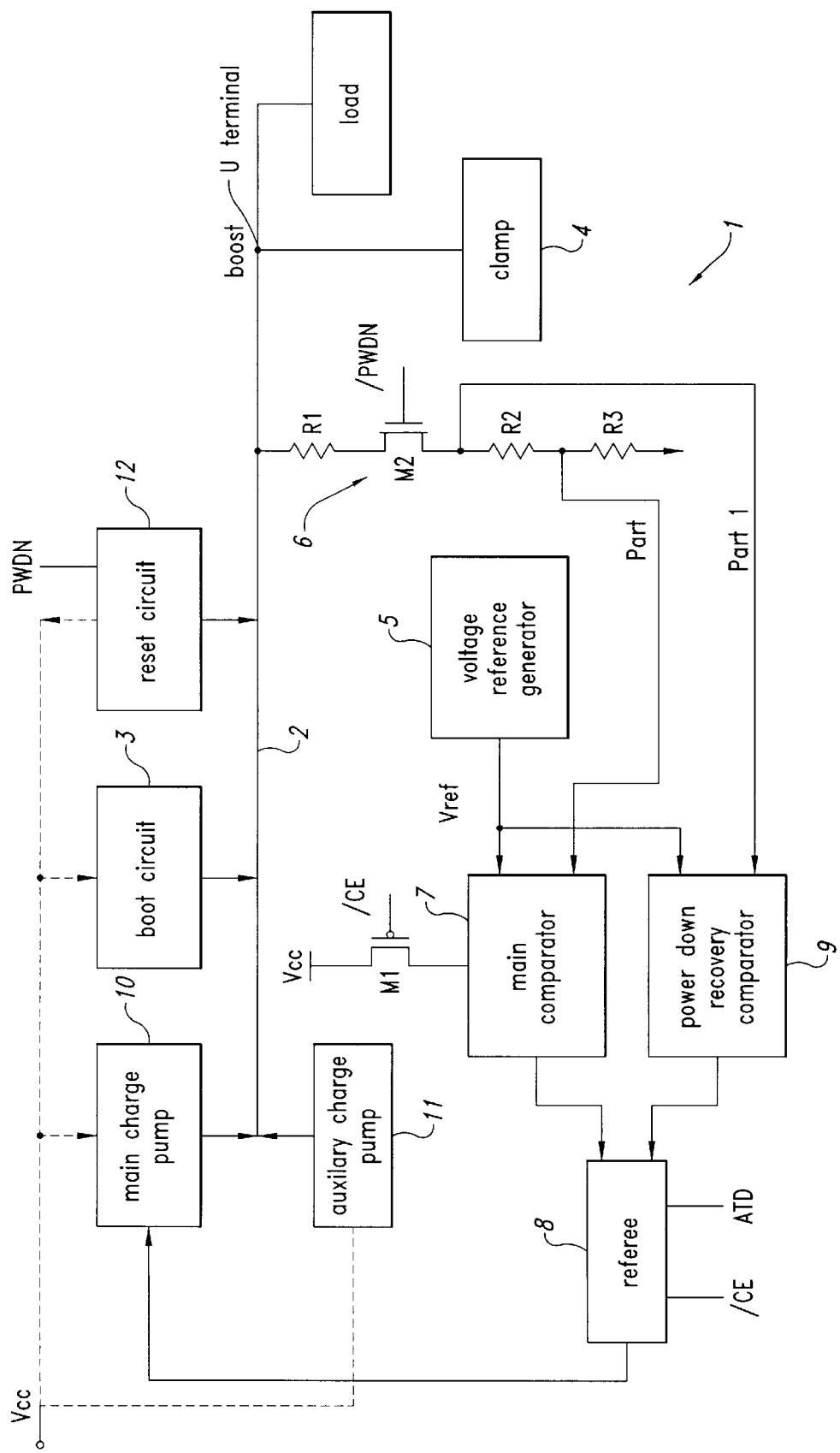
FIG. 3 shows a block diagram of the booster circuit in accordance with the present invention.

With reference to FIG. 3, reference number 1 indicates as a whole and schematically a charge pump voltage booster circuit provided in accordance with the present invention. The booster 1 comprises a circuit portion 3 for initialization connected to a reference supply voltage Vcc. The circuit portion 3 has its output connected to an output line 2 of the circuit 1. There is also provided a reset circuit portion 12 driven by the Deep Power Down signal in "not" logic indicated by /PWDN and connected at output both to the reference supply voltage Vcc and to the output line 2. Line 2 is connected to a U terminal on which is generated an output voltage Vboost which only initially corresponds to the supply voltage Vcc supplied by the circuit portion 3. A so-called clamp block 4 comprising essentially a chain of diodes is connected to the output terminal U. To the U terminal is connected a load LOAD external to the circuit 1 which, in this case, is a logical portion and in particular a portion placed before the reading phase of an electrically programmable read-only memory circuit, e.g., the flash EEPROM type.

The circuit 1 comprises also a generator 5 of a steady reference voltage generator Vref. The output of the generator 5 is connected directly to a first input of a first comparator 7 which will be designated below as a main comparator. The comparator 7 is supplied by the reference voltage Vcc through a field effect transistor M1 on the control terminal of which is applied a signal /CE which is discussed below. The output of the generator 5 is connected also to a first input of a second comparator 9 which is designated below as a secondary comparator. A voltage divider 6 is connected between the output line 2 and a second reference voltage, e.g., a ground signal GND. The divider 6 comprises the series of three resistors R1, R2 and R3 with the interposition of a field effect transistor M2 between the resistor R1 and the resistor R2. On the control terminal of the transistor M2 is applied a signal /PWDN corresponding in "not" logic to the switching-off signal Deep Power Down. An intermediate node of said divider 6 and in particular the contact point between the resistors R2 and R3 is connected to a second input of the main comparator 7. A second intermediate node of the divider 6 and in particular the contact point between the transistor M2 and the resistor R2 is connected to a second input of the secondary comparator 9. Advantageously in accordance with the present invention the main comparator 7 and the secondary comparator 9 have respective outputs connected to a control logic circuit 8 called below referee circuit. A referee circuit 8 receives also additional logic signals and in particular an inverted logic signal /CE designed to force a stand-by state and a signal ATD indicating the imminent current requirement by the load in connection with the starting of a read phase of the memory circuit connected to the U terminal. The referee circuit 8 has an output connected to a charge pump circuit portion 10. This portion 10 is designated below as a main charge pump. The main charge pump 10 is connected between the supply voltage reference Vcc and the output line 2. The internal structure of some circuit portions of the booster circuit 1 in accordance with the present invention and in particular that of the pump 10 is described in greater detail below. Advantageously in accordance with the present invention, the booster 1 comprises a second charge pump circuit portion 11 designated below as an auxiliary charge pump. The auxiliary charge pump 11 is connected between the reference supply voltage Vcc and the output line 2.

As described above, it is impossible to know "a priori" the duration of the stand-by state or that of the switching-off state since they are set by the external user. Therefore, it is not possible to know how much the output voltage Vboost falls during said intervals because of the leakage current on the load. If during the stand-by state the voltage Vboost should fall too much at the end of the stand-by, i.e., when the signal /CE switches to value 0, it would no longer be able to ensure access time to the memory compatible with the operational specifications of the load circuit. The secondary charge pump 11 has its own job of supplying a quantity of current greater or at least equal to that of leakage. The purpose of this second pump is thus to compensate during stand-by for the leakage current while holding the line 2 at the potential at which it was when it went into stand-by.

Figure 7:
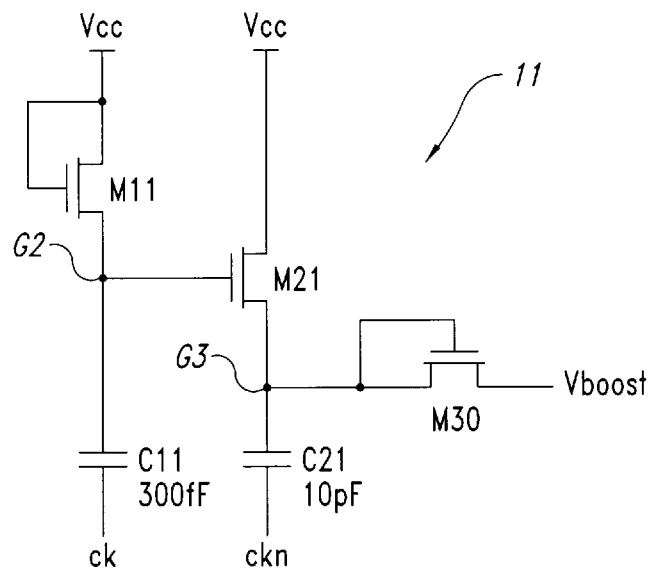
FIG. 7 shows a schematic view of a detail of the booster circuit in accordance with the present invention.
Figure 7:
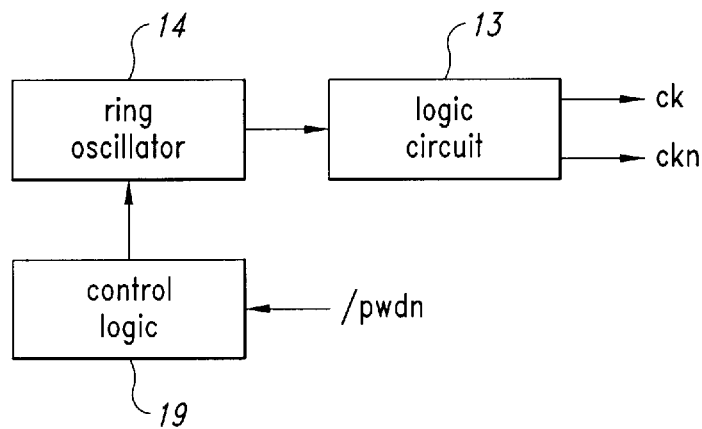

The structure of the pump 11 is shown in detail in FIG. 7. A first field effect transistor M11 is connected between the supply voltage Vcc and a circuit node G2. The transistor M11 is in diode configuration. To the circuit node G2 is connected also a first output of a logic circuit 13 and in particular a combinatory network connected downstream of a loop oscillator 14. The latter component is in turn connected downstream of a logic 19 receiving at input the signal /PWDN. Between the first output of the combinatory network 13 and the node G2 is inserted a capacitor C11 of 300 pF. The node G2 is the gate terminal of a second field effect transistor M21 which is connected between the power supply Vcc and a second circuit node G3. To the node G3 is also connected a second output of the logic circuit 13 by means of a second capacitor C21 of approximately 10 pF. On the first and second outputs of said logic circuit 13 are produced respective timing signals ck and ckn. The node G3 coincides with the gate terminal of a third field effect transistor M30 inserted in diode configuration between the node G3 and the output line 2 of the circuit 1.

The functional characteristics of the pump 11 are indicated below.

Asymptotic value: 2Vcc-Vt(30)

Oscillator frequency: ≅300 kHz

Average current consumption: ≅19 mA

The operation of the pump 11 is now discussed. Let us consider first the voltages present on the nodes G2 and G3 respectively connected to the gates of M21 and M30. It is assumed initially ck=ckn=0. It is readily found that:

V(G2)=Vcc-Vt(M11)

V(G3)=Vcc-Vt(M11)-Vt(M21)≅Vcc-2Vt(M11)

Vboost-Vcc-Vt(M11)-Vt(M21)-Vt(M30)≅Vcc-3Vt(M11).

When ck=1 and ckn=0 we have:

V(G2)=2Vcc-Vt(M11)

V(G3)=Vcc

Vboost=Vcc-Vt(M30)=Vcc-Vt(M30).

When ck=0 and ckn=1 we have:

V(G2)=Vcc-Vt(M11)

V(G3)=2Vcc

Vboost-Vcc-Vt(M30).

These are, of course, theoretical values. The combinatory network 13 serves to prevent the ck and ckn signals from being simultaneously one. If this should happen, M21 would be turned on, discharging C21 on the power supply and preventing rise of the output voltage. It can be assumed that the leakage, or sub-threshold, current of a frame of active area is on the order of 10 pA. During stand-by, the load consists of P-channel MOS transistors operating as row decoding drivers. To be sure of not underestimating the leakage current, simulations were made using a leakage current of approximately 3 mA. If the current delivered by the secondary pump 11 were greater or equal to that of leakage it is always certain that during the stand-by phase the potential Vboost does not decrease or in the worst case it remains steady and tends towards the asymptotic value of 2Vcc-Vt.

There is now described the operation of the circuit 1 and the characteristics of the method in accordance with the present invention. First it is necessary to remark that the circuit 1 is required to operate as a positive charge pump taking the output line 2 to a voltage on average greater than 4V. The separate operating phases of the booster circuit in accordance with the present invention are identified by four distinct states for each of which are shown in the following table the absorbed current specifications.

TABLE 1

| state | /PWDN | /CE | Imin | Ityp | Imax |
|---|---|---|---|---|---|
| deep power down | 0 | — | | 0.2 µA | 1.2 µA |
| power down recovery | 600 ns from positive front of /PWDN if /CE = 1 | | | 25 mA | |
| stand-by | 1 | 1 | | 45 µA | 120 µA |
| active[1] | 1 | 0 | | | 30 mA |

[1]Maximum current is reached during the writing phase of a memory word. Imax during the reading phase is 25 mA.

The maximum currents called for by these specifications have an effect on the operation of the circuit 1 and in particular it will be virtually eliminated in the deep power down state while its consumption during stand-by state will be limited.

Figure 4:
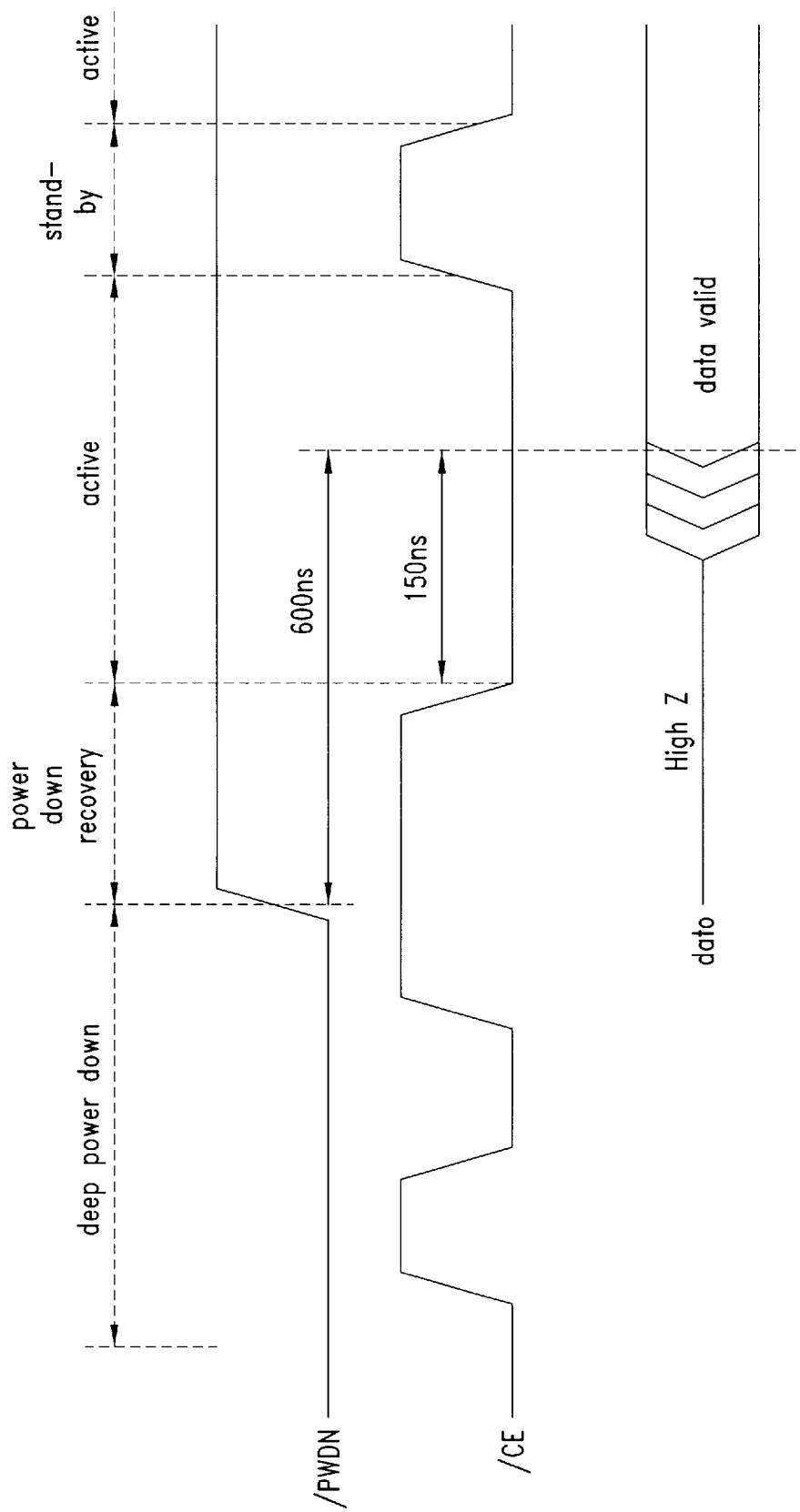
FIG. 4 shows a comparative timing diagram of logic signals for piloting of the booster circuit of FIG. 3.

FIG. 4 shows graphically the behavior in time of the logic signals which allow switching of the circuit 1 in the various operating states. The operating states are essentially four, i.e., deep power down, reset, activation and stand-by. With the aid of this figure we can analyze the various states, operating or not, of the circuit 1 starting from an initial off state termed Deep Power Down. Very briefly, the signal /PWDN represents a type of reset of the circuit 1 since in the off state it is not possible to determine to what value the potential Vboost is brought unless it is to a lower limit. At the end of the off state there is activated the main pump 10 to be certain that the output voltage Vboost reaches a value such as to satisfy the specifications in terms of access time to the memory circuit connected as load. From this instant forward it is the secondary pump 11 which ensures holding on the line 2 a voltage higher than a predetermined threshold, for example, 3.8 V.

These operating phases are now discussed in detail. In the Deep Power Down state consumption must be very low. Both the charge pumps 10 and 11 are off and the static current paths are all disabled. The reset circuit 12 is capable of detecting the instant the booster is requested to emerge from this off state. This instant coincides with the reception of the impulse /PWDN which is in an active high state. Now let us assume forcing of the signal /CE to 1. The potential Vboost discharges because of the current leakages on the load until it reaches a minimum value near Vcc and set by the initialization block 3. When the signal /PWDN switches there is created a state of Power Down Recovery whose maximum duration is set at 600 ns for operational response requirements. The referee circuit 8 appraises whether to activate the main pump 10 on the basis of the signals received from the comparators 7 and 9 of the feedback loop. If the answer is affirmative, average current consumption rises above one milliampere and remains at this level until the feedback stops the pump 10. The Power Down Recovery state thus represents a demarcation line between the off state and the active state, or between the off state and the stand-by state.

But let us assume that the circuit has emerged from the off state for more than 600 ns and that at the same time the signal /CE is held at the high value 1. The line 2 will have a potential Vboost between a value near Vcc and the maximum value allowed by the feedback. When /CE switches to 0, it is necessary to take the output U to the boosted voltage called for by the specifications in the shortest possible time. This time is set at 150 ns for operational response requirements. Now, as shown in FIG. 4, to comply with this tight specifications and make available an output amount between the above said period of 150 ns, the pump 10 is kept active for a time less than 600 ns. In the circuit in accordance with the present invention this time specification is essentially converted into an equivalent voltage specification. In other terms, after verification that in the worst case the output voltage reaches the 3.8V within 600 ns, the feedback is adjusted on this voltage. Therefore the secondary comparator 9 compares the reference Vref with the signal taken from the voltage divider 6 and when the Vboost exceeds the threshold of 3.8V it transmits to the referee circuit 8 a signal for turning off the main pump 10. To the referee circuit 8 therefore is assigned control of turning on and off the main pump 10 through the feedback loop of the comparators 7 and 9.

It is noted that, when leaving the off state, the circuit can be taken directly into an activation state in which both the pumps 10 and 11 are on. In this state the circuit is in full activity to supply all the current necessary to the load which is absorbing it. The secondary pump 11 supplies a very small contribution to raising of the potential of the output line 2. The line 2 is thus left on since it consumes very little and complicating the circuit layout to insert any logic gates assigned to turn it off is not justified. Advantageously insertion of the auxiliary pump 11 allows making up for the leakage currents always present on the load when the circuit is in stand-by state. The presence of the secondary pump 11 allows holding output voltage Vboost at the value it had when the circuit went into stand-by. Overall therefore the main pump 10 works during the active and Power Down Recovery states while the requirement to turn off this pump during stand-by is created. By contrast, just the secondary pump 11 works in the stand-by phase to hold the voltage at the level to which the main pump brought the line 2 before entering this state.

Many features in the structure of the main charge pump 10 are well known and the details are illustrated schematically for the sake of completeness of the description with reference to FIGS. 5 and 6. The main pump 10 comprises five stages 15 having two modules 16 each. The stages 15 are connected in parallel to increase the quantity of current to be fed into the output line 2 of the circuit 1. The schematic structure of the pump 10 is shown in FIG. 5. A loop oscillator 17 driven by a clipper signal produced by a control logic 18 produces at output respective synchronism signals ck and ckn applied to the various stages 15 of the pump 10. Each stage 15 comprises a pair of modules 16a, 16b of identical structure and connected between the power supply Vcc and the output line 2 of the circuit 1. Each module 16 comprises a corresponding field effect transistor M10, M20 having terminals connected between the power supply Vcc and the line 2. The gate terminal of the transistors M10, M20 coincides with a circuit node A, B. The node A of the first module 16a is connected to the power supply Vcc by means of a diode D1 and to the line 2 by means of a diode D2. The node B of the second module 16b is connected to the power supply by means of a diode D3 and to the line 2 by means of a diode D4. The node A receives the signal ck of the oscillator 17 by means of a first capacitor C1 while the node B receives the signal ckn of the oscillator 17 by means of a second capacitor C2.

Now we shall discuss the operation of the i-th stage 15 starting from an initial condition in which ck=ckn=0. The internal nodes A and B are brought to a potential of Vcc-Vt where Vt is the threshold voltage of the diode D1 or D3 which connects them to the power supply Vcc. Vboost is then brought to the value Vcc-2Vt1. Analyzing the case where the logical signals ck and ckn driving the pump are activated, let us assume that said signals are mutually complementary. When ck switches to a high logic value (and ckn=0) the capacitor C1 transfers the voltage difference present on the node A, taking it to 2Vcc-Vt(D1). The gate terminal of M10 is thus voltage-boosted connecting the node B to the power supply Vcc. In this phase the output line 2 has a potential equal to:

$$Vboost=2\ Vcc-Vt(D1)-Vt(D2)=2\ Vcc-2\ Vt \quad (3)$$

When ck switches to the value 0 and ckn rises to a high logic value, the nodes A and B take these values: VA=Vcc-Vt(D1): M10 goes off and C2 transfers to the node B the voltage difference set on it by the signal ckn. In this manner the gate of M20 is voltage boosted, rising to 2Vcc and allowing the output U to move to its maximum value which is:

$$Vboost=2\ Vcc-Vt\ (D4) \quad (4)$$

Of course this is an asymptotic value which the output reaches in a predetermined period of time. The signals ck and ckn which pilot the pump 10 are supplied by the loop oscillator 17 which works at a frequency of 58 MHz. The clipper signal of the logic 18 is employed to activate and deactivate the operation of the oscillator 17 and with it the charge pump 10. The starting and stopping conditions of the latter are given by the above equations (1) and (2). The pump 10 consumes approximately 1.6 mA when active while it has negligible consumption when off. During the Deep Power Down state the pump is off in any case to respect the current consumption specifications.

The circuit in accordance with the present invention solves the technical problem and achieves numerous advantages. Tests performed with an oscilloscope using Picoprobes allowed measurement of the time elapsing between the output from the off state and the instant at which the line 2 reaches a voltage of 4V. These measurements showed that the circuit 1 in accordance with the present invention is capable of verifying the specification on the time necessary to bring the output to 4V when the off state ends. Furthermore, the measurements showed that the average consumption during the stand-by state never exceeds the specifications of Table 1. There was also noted less ripple on the output signal due probably to the stabilizing effect which the load has on the circuit 1. Specifically the pulse /ATD indicates that there is about to be performed a reading of the memory circuit connected as load. This information is used to activate the oscillator 17 which boosts the main pump 10 to reduce the ripple of the line 2. This addition of charge to the output line 2 is made in any case upon reception of a pulse /ATD. If the charge added upon each reading is greater than that delivered to the load, the line 2 rises towards an asymptotic value expressed by the relationship of equation (3). Current consumption in the stand-by state is also particularly small while allowing holding of the specifications in terms of recovery and access time.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

We claim:
1. A charge pump voltage multiplier circuit, comprising:
   a first charge pump having an input and an output node coupled to a load, the first charge pump being structured to generate at the output node a boosted voltage relative to a supply voltage;
   a feedback circuit including
      a first comparator having a first input coupled to the output node, a second input coupled to a reference voltage, and an output, the first comparator being structured to generate a signal based on a comparison of the voltage at the output node with the reference voltage; and
      a control logic circuit having a first input connected to the output of the first comparator and an output coupled to the input of the first charge pump, the control logic circuit being structured to turn on the first charge pump for a period of time less than a preselected time period based on the signal generated by the first comparator;
   a second charge pump coupled to the output node and being structured to generate a current to compensate for a leakage current drawn by the load; and
   a second comparator having a first input coupled to the output node, a second input coupled to the reference voltage, and an output, the second comparator being structured to generate a signal based on a comparison of the voltage at the output node with the reference voltage, the control logic circuit having a second input connected to the output of the second comparator, the control logic circuit being structured to turn on the first charge pump for a period of time less than a preselected time period based on the signals generated by the first and second comparators.

2. The multiplier circuit according to claim 1 wherein the second charge pump draws substantially less current than the first charge pump.

3. The multiplier circuit according to claim 1 wherein the current generated by the second charge pump is greater than or equal to the leakage current drawn by the load when the multiplier circuit is in a stand-by state.

4. The multiplier circuit according to claim 2 wherein the first charge pump is activated by the control logic circuit for a period of time less than the preselected time period when the multiplier circuit emerges from an off-state.

5. The multiplier circuit according to claim 2 wherein the second charge pump is activated when the multiplier circuit emerges from an off-state.

6. A charge pump voltage multiplier circuit, comprising:
   a first charge pump having an input and an output node coupled to a load, the first charge pump being structured to generate at the output node a boosted voltage relative to a supply voltage;

a feedback circuit including a first comparator having a first input coupled to the output node, a second input coupled to a reference voltage, and an output, the first comparator being structured to generate a signal based on a comparison of the voltage at the output node with the reference voltage; and a control logic circuit having a first input connected to the output of the first comparator and an output coupled to the input of the first charge pump, the control logic circuit being structured to turn on the first charge pump for a period of time less than a preselected time period based on the signal generated by the first comparator; and a second charge pump coupled to the output node and being structured to generate a current to compensate for a leakage current drawn by the load, the second charge pump comprising:

a first MOS transistor configured as a diode;

a first capacitor connected in series with the first MOS transistor and defining a first node therebetween;

a second MOS transistor having a control terminal connected to the first node;

a second capacitor connected in series with the second MOS transistor and defining a second node therebetween; and a third transistor configured as a diode and connected between the second node and the output node of the multiplier circuit.

7. The multiplier circuit according to claim 6 wherein the second charge pump further comprises:

a first logic circuit having a first output connected to the first capacitor and a second output connected to the second capacitor;

an oscillator connected to the first logic circuit; and a second logic circuit having an output connected to the oscillator and an input structured to receive a turn-off signal to turn off the second charge pump during an off state of the multiplier circuit.

8. A method of providing an elevated voltage level on an output node of a charge pump voltage multiplier circuit having first and second charge pumps coupled to the output node comprising:

turning off the first and second charge pumps in a deep power down state;

turning on the first charge pump to raise the voltage at the output node during a power down recovery state;

turning on the second charge pump to provide current to the output node during an active state following the power down recovery state;

turning off the first charge pump based on a feedback signal from the output node; and maintaining the operating state of the second charge pump to provide current to the output node during a stand-by state.

9. The method according to claim 8, further comprising the act of turning on the first charge pump during an active state subsequent to the stand-by state to maintain the voltage at the output node.

10. The method according to claim 8 wherein the act of maintaining the operating state of the second charge pump includes the act of generating a current greater than or equal to a leakage current drawn by a load coupled to the output node when the multiplier circuit is in the stand-by state.

11. The method according to claim 8 wherein the act of turning on the first charge pump comprises the act of turning on the first charge pump for less than a preset time period when the multiplier circuit emerges from the deep power down state.

12. A charge pump voltage booster circuit with a control feedback comprising an output line connected to a load on which is produced an output voltage boosted in relation to a power supply and a feedback loop incorporating a main charge pump coupled to the output line and a control logic circuit having a first input coupled to an output of a first comparator having an input coupled to the output line, the first comparator being structured to generate at its output a signal based on a comparison between the output voltage and a reference voltage, and an auxiliary charge pump coupled to said output line to provide current to compensate for leakage currents drawn by the load the control logic circuit being structured to turn on the main charge pump for a period of time less than a predetermined time period based on the signal generated by the comparator; and a second comparator having a first input coupled to the output line, a second input coupled to the reference voltage, and an output, the second comparator being structured to generate a signal based on a comparison of the output voltage with the reference voltage, the control logic circuit having a second input connected to the output of the second comparator, the control logic circuit being structured to turn on the main charge pump for a period of time less than a predetermined time period based on the signals generated by the first and second comparators.

13. A circuit in accordance with claim 12 wherein said auxiliary charge pump consumes much less current than the main charge pump.

14. A circuit in accordance with claim 12 wherein said auxiliary charge pump supplies a current greater than or equal to said leakage currents.

15. A circuit in accordance with claim 13 wherein said main charge pump is turned on by the control logic circuit for the period of time less than the predetermined time period when the circuit comes out of an off state.

16. A circuit in accordance with claim 13 wherein said auxiliary charge pump is driven by a turn-off signal according to negative logic.

17. A charge pump voltage booster circuit with a control feedback comprising an output line connected to a load on which is produced an output voltage boosted in relation to a power supply and a feedback loop incorporating a main charge pump coupled to the output line and a control logic circuit coupled to an output of a comparator having an input coupled to the output line, the comparator being structured to generate at its output a signal based on a comparison between the output voltage and a reference voltage, and an auxiliary charge pump coupled to said output line to provide current to compensate for leakage currents drawn by the load the control logic circuit being structured to turn on the main charge pump for a period of time less than a predetermined time period based on the signal generated by the comparator, wherein said auxiliary charge pump comprises a first field effect transistor connected between the power supply and a first circuit node to which is also coupled a first output of a first logic circuit connected downstream of a loop oscillator which is connected downstream of a second logic circuit receiving at an input a turn-off signal, there being inserted between said first output of the first logic circuit and said first circuit node a capacitor, said first circuit node being connected to a control terminal of a second field effect transistor connected between the power supply and a second circuit node to which is coupled a second output of the first logic circuit, a second capacitor being connected between the second output of the first logic circuit and the second circuit node and said second circuit node being connected to a control terminal of a third field effect transistor inserted in a diode configuration between the second circuit node and said output line of the circuit.

18. A method for holding steady a predetermined voltage level on an output line of a charge pump voltage booster circuit connected to a load, the load drawing leakage currents when the booster circuit is in a stand-by state comprising:

coupling a main charge pump to the output line;

coupling an auxiliary charge pun to the output line;

turning off the main charge pump and the auxiliary charge pump in a deep power down state;

turning on and providing power to the main charge pump to raise a voltage on the output line for a period of time less than a preselected period of time during a power down recovery state after the booster circuit is activated from the deep power down state, the main charge pump being turned on based on a feedback signal from the output line to provide a boosted voltage to the output line;

turning on the auxiliary charge pump after the booster circuit is activated from the deep power down state to provide current to the output line during an active state following the power down recovery state;

turning off the main charge pump based on the feedback signal from the output line; and maintaining the operating state of the auxiliary charge pump to provide current to the output line during the stand-by state.

19. A method in accordance with claim 18, further comprising the act of providing power to said auxiliary charge pump which is much lower than the power provided to the main charge pump.

20. A method in accordance with claim 18 wherein the act of turning on the auxiliary charge pump includes the act of providing a current greater than or equal to the leakage currents drawn by the load when the booster circuit is in the stand-by state.

21. A multiplier circuit according to claim 1, further comprising:

a voltage divider connected to the output node, the first input of the first comparator being connected to the voltage divider.

* * * * *